(12) United States Patent
Berger et al.

(10) Patent No.: US 7,375,480 B2
(45) Date of Patent: May 20, 2008

(54) METHOD AND DEVICE FOR THE PRODUCTION OF TWO-CHANNEL OR MULTI-CHANNEL PULSE-WIDTH MODULATED RECTANGULAR PULSES

(75) Inventors: Erik Berger, Vienna (AT); Martin Eisner, Weigelsdorf (AT); Martin Meschik, Vienna (AT); Navid Rahmanian Shahri, Vienna (AT)

(73) Assignee: Siemens Aktiengesellschaft, Munich (DE)

( * ) Notice: Subject to any disclaimer, the term of this patent is extended or adjusted under 35 U.S.C. 154(b) by 379 days.

(21) Appl. No.: 10/531,199

(22) PCT Filed: Oct. 1, 2003

(86) PCT No.: PCT/EP03/10867

§ 371 (c)(1),
(2), (4) Date: Nov. 2, 2005

(87) PCT Pub. No.: WO2004/036749

PCT Pub. Date: Apr. 29, 2004

(65) Prior Publication Data

US 2006/0055483 A1 Mar. 16, 2006

(30) Foreign Application Priority Data

Oct. 16, 2002 (DE) ................ 102 48 304

(51) Int. Cl.
*H02K 21/00* (2006.01)

(52) U.S. Cl. ........................ 318/254; 318/439; 318/138
(58) Field of Classification Search ................ 318/254, 318/138, 439, 599, 811; 323/205; 308/804
See application file for complete search history.

(56) References Cited

U.S. PATENT DOCUMENTS

| 5,227,961 | A | 7/1993 | Claydon et al. |
| 5,506,484 | A | 4/1996 | Munro et al. |
| 5,963,107 | A | 10/1999 | Nagano et al. |
| 6,002,213 | A | 12/1999 | Wood |
| 2005/0189891 | A1* | 9/2005 | Kurosawa et al. .......... 318/254 |

FOREIGN PATENT DOCUMENTS

DE 264 186 A1 1/1989

* cited by examiner

*Primary Examiner*—Karen Masih

(57) ABSTRACT

The invention relates to a method and a device for the production of two-channel or multi-channel pulse-width-modulated rectangular pulses. According to the invention, exactly one pulse is discharged within a period in each channel. The inception of a pulse in relation to the moment of inception is delayed by an actual dead time. The dead time is respectively kept constant for at least one period and a new value for the dead time is produced for a modulation of the pulse width and/or a new value is produced for the duration of the period and the actual dead time and/or the actual duration of the period is set at the beginning of the desired period according to the new value of the dead time and/or duration of the period.

16 Claims, 5 Drawing Sheets

METHOD AND DEVICE FOR THE PRODUCTION OF TWO-CHANNEL OR MULTI-CHANNEL PULSE-WIDTH MODULATED RECTANGULAR PULSES

CROSS REFERENCE TO RELATED APPLICATIONS

This application is the US National Stage of International Application No. PCT/EP03/10867, filed Oct. 1, 2003 and claims the benefit thereof. The International Application claims the benefits of German application No. 10248304.3 filed Oct. 16, 2002, both of the applications are incorporated by reference herein in their entirety.

FIELD OF INVENTION

The invention relates to a method for the production of two-channel or multi-channel pulse-width modulated rectangular phases.

The invention also relates to a device for the production of two-channel or multi-channel pulse-width modulated rectangular pulses.

BACKGROUND OF INVENTION

For the control of specific forms of circuit, e.g. transformers, multiphase motors etc. it is often necessary, if two or more pulse-width modulated activation signals are used, for these signals to have a specific waveform, in order to avoid such a transformer becoming saturated, and is thereby damaged or destroyed.

Previously such control signals have been produced by using two or more pulse-width modulated signals which must have the same switch-on time in consecutive time segments. In addition the other control output must be blanked in each second phase in each case.

This procedure is complex and time consuming however, and if a microcontroller is used for control, in some cases up to 80% of the resources of the microcontroller are used just for the production of symmetrical, pulse-width modulated control signals, so that only a few of the microcontroller's resources are available for other tasks.

For the control of multi-phase motors for example, such as 5-phase motors, which is possible with the signals mentioned at the start, high transition losses occur with the conventional method of changing the speed of the motor.

SUMMARY OF INVENTION

An object of the invention is to produce two or more pulse-width modulated signals in a simple way which preserves resources.

It is a further object of the invention to produce two-channel or multi-channel pulse-width modulated signals which allow high transition losses to be avoided.

These objects are achieved with the method mentioned at the start or with the device mentioned at the start in that, in accordance with the invention, exactly one pulse is discharged within a period in each channel and that the inception of a pulse in relation to the moment of inception is delayed by an actual dead time, the dead time is kept constant in each case for at least one period, and for a modulation of the pulse width, a new value for the dead time and/or a new value for the duration of the period is produced and the current dead time and/or the current duration of the period is set at the beginning of the desired period to the new value of the dead time and/or the period duration.

Through this "block mode", in which each channel is activated and then deactivated for a specific time, the frequent switching on and switching off in the operation of a multiphase motor for example, which leads to high transition losses when changing the speed of the motor, is avoided.

In addition, the effect of changing the dead time and the duration of the period—which can be used as an alternative or in addition—is that the signals, i.e. the rectangular pulses of the signals of a period widen or narrow all channels to the same extent, thus producing a "symmetrical" pulse width modulation under certain circumstances. The invention can easily be implemented since only one or two parameters—the dead time and/or the period duration—must be altered accordingly.

Non-overlapping symmetrical signals are especially easy to produce when two consecutive pulses on different channels are each separated from each other in time by an actual dead time.

To reliably ensure that a change to one of the parameters does not take effect during a current period but at the earliest during the next period, the new value of the dead time and/or the duration of the period is buffered independently of the current value of the dead time and/or the duration of the period and the actual value is overwritten with the new value at the beginning of the desired period.

The invention is especially easy to implement when the dead time and/or the duration of the period is set to the new value at the beginning of each period. The presetting means that the current value is overwritten with the buffered value at the beginning of each period, even if these have not changed in the interim. This means that the complicated programming which only executes this type of update if the parameters dead time or duration of the period have actually changed is not necessary so that simple implementation is possible.

Symmetrical signals are particularly simple to obtain if the maximum pulse width for a channel is set to the duration of the period divided by the number of channels.

In particular there is provision here that with two channels the maximum pulse width is set to half the duration of a period.

There is further provision that with n channels, after the duration of the maximum pulse width has elapsed for the first to the (n−1) channel in each case, an interrupt signal is generated and the beginning of the dead time for the next channel is displayed as well as at the end of the period an interrupt signal is generated with which the beginning of the dead time for the first channel or the beginning of a new period is marked.

It is useful in this case for the overwriting of the current dead time and/or the actual period duration with the new value for the dead time and/or the period duration to be initiated with the interrupt signal since in this way it is ensured that these changes have no effect on the current period.

It is generally true to say that both pulse width and period duration as well as dead time can be updated using an interrupt. Therefore the corresponding registers are also double buffered.

In order for a double buffering of the dead time to be possible so that at each change of the dead time, i.e. a generation or a second value for the dead time without affecting the current period is possible, the control in accordance with the invention features two dead time registers, a dead time master register and a dead time slave register and a new value for the dead time is buffered independently of the current value of the dead time stored in the dead time slave register.

Likewise the control for a double buffering of the period duration additionally or alternatively features two period registers, a period master register and a period slave register, and the new value for the period duration is buffered independently of the current value stored for the period duration in the period slave register.

To reliably enure that no influence is exerted on the current period the control is set up so as to overwrite the value stored in a slave register with the value buffered in a master register at the beginning of the desired period.

The control can be especially simply implemented if it is set up to overwrite the value stored in a slave register with the value buffered in a master register at the beginning of each period.

BRIEF DESCRIPTION OF THE DRAWINGS

The invention is explained below in more detail on the basis of the drawing. The Figures show FIG. 1 a transformer with a control unit, FIG. 2 a timing diagram for the two outputs of the control unit 1, FIG. 3 a further timing diagram, FIG. 4 a block diagram of the hardware on which the invention is based, FIG. 5 a timing diagram of the pulse width modulation in accordance with invention, and FIG. 6 a timing diagram for a 5-phase control.

DETAILED DESCRIPTION OF INVENTION

Figure 1:
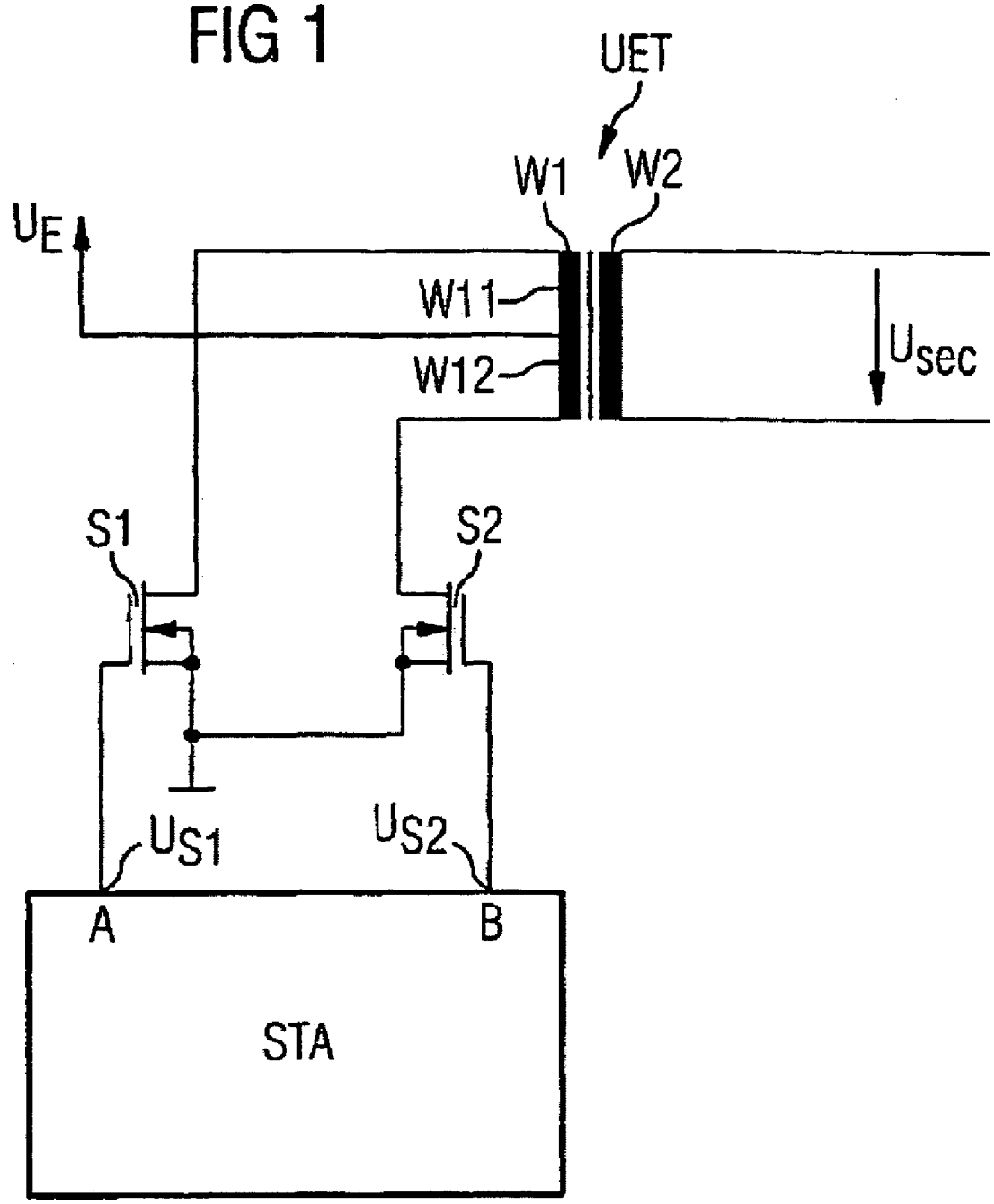

FIG. 1 shows of a transformer UET with a primary winding W1 consisting of two halves W11, W12 and of a secondary winding W2. A dc input voltage LE, e.g. 12 V, lies with its plus pole in the center of the primary winding W1 and is directed with its minus pole via a first separate switch S1 to the start of the first winding half W11 and via a second controlled switch S2 to the end of the second winding half W12. The two controlled switches S1, S2, field effect transistors in this case, can be controlled by a control circuit STA. The secondary voltage of the transformer produced is designated $U_{sec}$.

Figure 2:
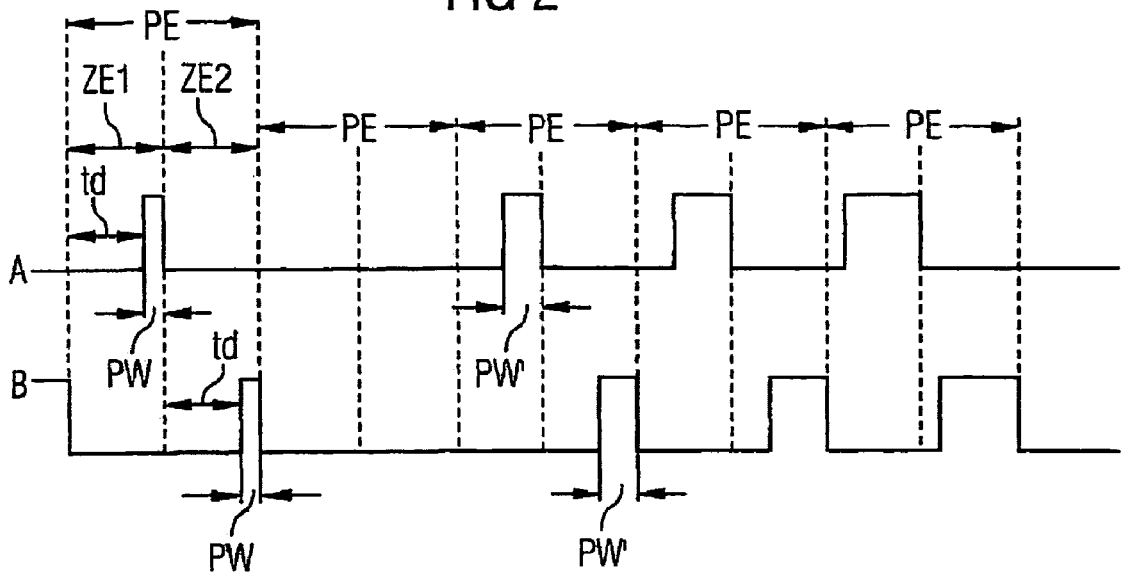

As can be seen from FIG. 2, two opposed-polarity pulse-width-modulated rectangular pulses are applied to the primary winding W1, with each pulse being modulated in accordance with a half wave of the alternating current to be generated. In this case the impulses of the two pulses are offset in relation to each other in each case so that the impulses of one pulse fall in the gaps of the other pulse.

These activation impulses, i.e. the voltages US1 and US2, are shown under "A" and "B" in FIG. 2 for the two controlled switches S1, S2. The opposed polarity of the pulses is achieved here by alternately switching the input voltage UE to one of the two winding halves W11, W12. For a one-piece primary winding W1 four controlled switches would have to be used to obtain this opposed polarity.

A transformer solution such as the one shown in FIG. 1 needs so-called "symmetrical" pulse sequences "A" and "B", i.e. symmetrical voltage forms US1, US2 at the outputs of the control circuit STA to prevent the transformer becoming saturated which would lead to the transformer being damaged or destroyed.

Such "symmetrical" pulse sequences are shown in FIG. 2. During a period PE which is divided into a first time area ZE1 for the first output A and into a further time area ZE2 for the second output B, the pulse A here has in the first time area ZE1 at the first output of the control STA the same width as the pulse B in the second time area ZE2 at the second output. The time areas ZE1, ZE2 in this case simultaneously represent the maximum pulse width of a signal at one of the outputs A, B.

With such a pulse sequence the pulse width can be simply set by changing the width of the pulse to the new value. With two or more such signals as shown in FIG. 2 an increase of the pulse width of the first pulse A however leads to a corresponding reduction in the width of the second pulse B, in a this case there are then no longer any symmetrical pulse sequences present, the transformer goes into saturation, which is to be prevented.

In principle it is possible for the pulse width of signal A to make up the entire duration of the time area ZE1 and the pulse width of the signal B to make up the duration of time area ZE2. As can be seen from FIG. 2 and in even greater detail FIG. 3, what is referred to as a "dead time" td is further provided and a pulse begins in a period PE only after this dead time td has elapsed. The pulse of signal B only begins after signal A has elapsed and here too only after the dead time td has elapsed.

The generation of a dead time for half-bridge or full-bridge operation normally has the sense of preventing a bridge crossover current which would destroy the power transistors and which occurs it the two semiconductors present in the bridge are simultaneously conductive (in series).

This dead time is mostly set to a fixed value on initialization of controls, such as microcontrollers, and adapted to the power semiconductors and their driver circuits. The pulse width for each of the power semiconductors such as transistors can assume a value of between 0% and 100% of the duration of the time area ZE1 or ZE2 in each case.

The invention now makes use of this dead time td in that, by changing the dead time td, it also changes the pulse width PW of the relevant signals A, B. As can be seen from FIG. 3, an increase in the dead time td to a new value td' (td'>td) leads to a corresponding reduction in the pulse width PW of the signals A, B to a new value PW'. A reduction of the dead time td leads to the same extent to an increase in the pulse width (see FIG. 2).

The advantage of this process is that the pulse widths are symmetrically modulated, i.e. a pulse width change of a first signal leads to the same extent to changes in the pulse width of the second or further output signals.

Figure 3:
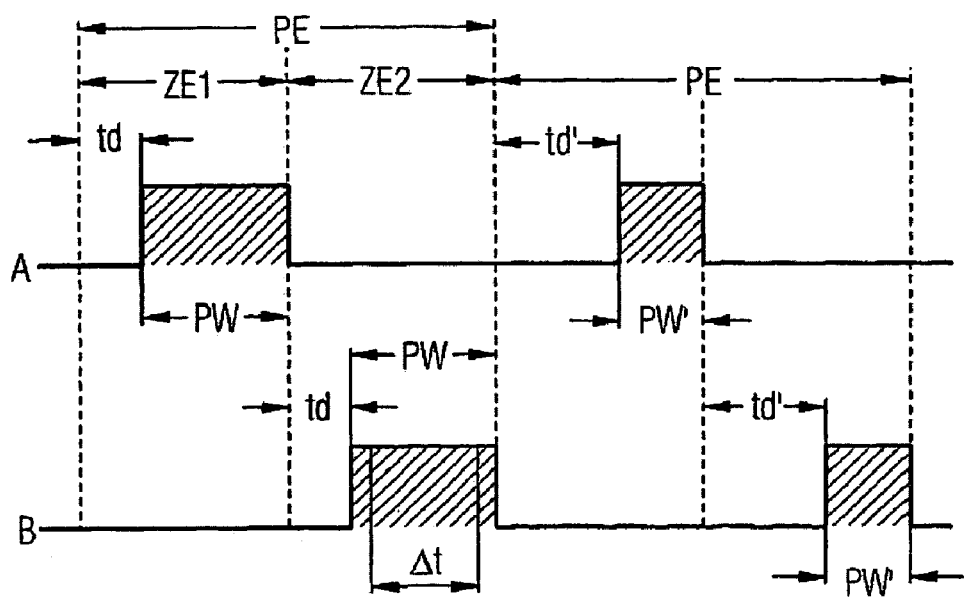

By looking at FIG. 3 it can be seen at that without double buffering of the dead time essentially only a small time segment Δt remains in which the dead time, or a dead time register, for example of a microcontroller in which the value for the dead time is stored, may be changed.

The dead time td may only be changed in the second half of the period, i.e. during the time area ZE2 and only then to the new value td' when the dead time td has already elapsed. In addition the dead time must be prevented from switching off the outputs by being loaded with a new value, e.g. if one were to sharply increase the dead time this would lead to output B switching off.

If the pulse width PW is very small (almost 0%), it is also possible to load the dead time for the next period. The result is a missing pulse, non-symmetrical pulse-width-modulated signals or double pulses at an output.

By contrast to the production of a conventional pulse-width-modulated signal by means of a pulse width register in a microcontroller CON, there is thus provision in accordance with the invention, for generating symmetrical pulse-width-modulated signals, for a double-buffered dead time register with the corresponding resolution (10 bits and greater) to be used.

In this case two further dead time registers, a master and a slave register, as explained in greater detail below, are added to the dead time register which is present in any event at the microcontroller CON, or the dead time register already present at the microcontroller CON is supplemented by a further additional register.

The first case is useful if the microcontroller CON is expanded for the invention by a further hardware module. The second case is useful for developing a new microcontroller.

Figure 4:
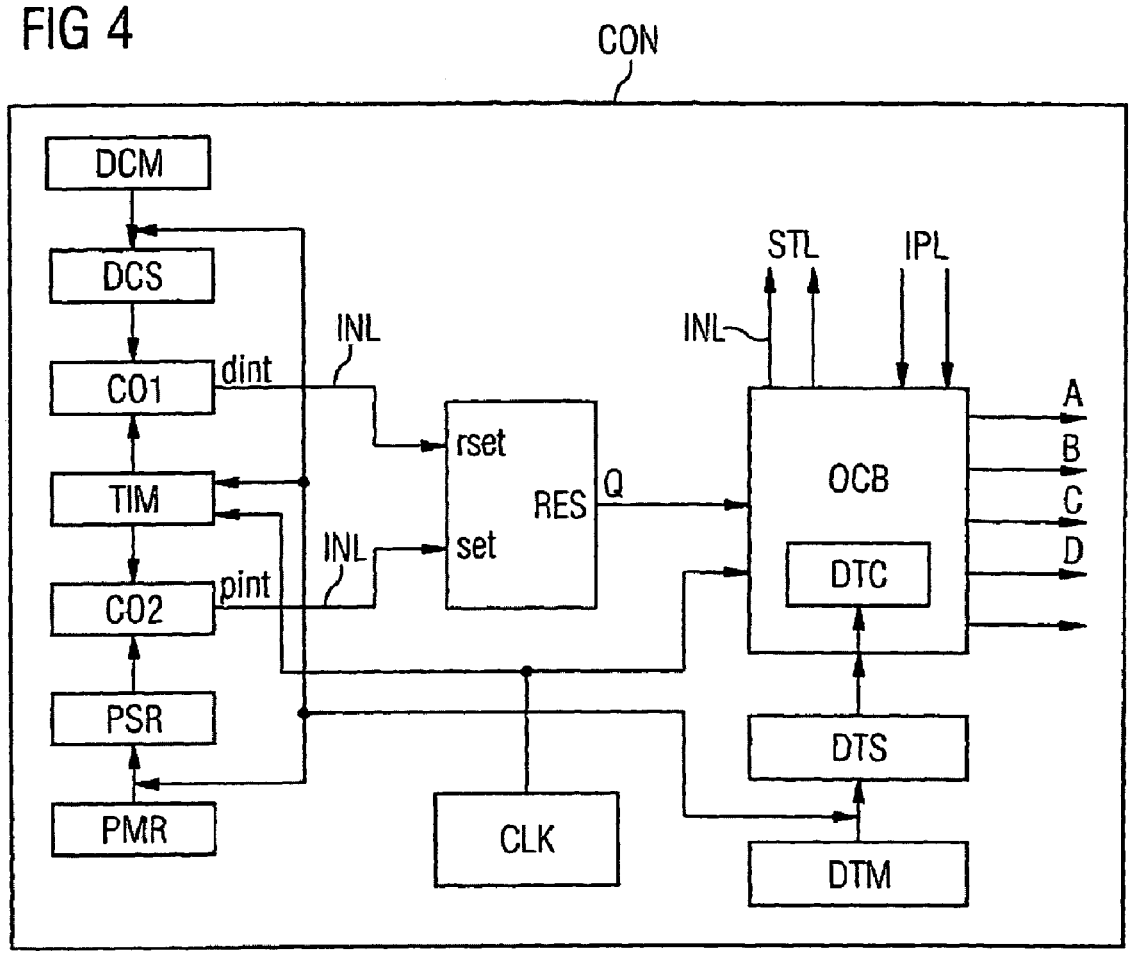

As can be seen from FIG. 4 the inventive device, here in the form of a microcontroller CON, features two or more outputs A, B, C, D, . . . which are switched alternately in a chronological sequence. The main clock here comes from output Q, the timer TIM is the clock generator.

The detailed explanation below starts from the assumption that there are two outputs A, B. So that two consecutive pulses at the two outputs A, B of the controller CON are exactly the same, a) the desired frequency (period) is first set,
b) the (maximum) pulse width, i.e. the duration of a time area ZE1, ZE2, which is output alternately at output A and output B, is set to exactly 50% of the period duration, and
c) the dead time register is modulated instead of the pulse width register in accordance with the curve form desired on the secondary side of the transformer. A change in the dead time td here has the effect of making the two pulses at the outputs A and B larger or smaller by the same value and thus of symmetrically modulating the signals.

This update of the dead time td can advantageously be performed under interrupt control, since in this case the normal execution sequence of a program is interrupted by a high-priority event and this event is processed (in this case the update of the dead time), and subsequently there will be a return to the normal execution sequence in the program. Double buffering is necessary so that an update of the dead time only occurs in the next period and not during the current pulse, as will be explained in more detail below with reference to FIGS. 4 and 5.

In FIG. 4 the hardware components used and the way that they interact is explained with reference to a block diagram in greater detail.

The clock is specified with the Clock Source CLK which is aligned to the desired resolution and frequency of the pulse width modulated signals to be produced. Mostly the clock is derived from a master oscillator of the microcontroller used Various prescalers and postscalers which can be executed under program controlled ensure that there is great flexibility in the programming of the desired scaler ratio. This is advantageous for a reason that the master oscillator as a rule runs in the MHz range which would be too high to produce a symmetrical pulse-width-modulated signal of for example 20 kHz.

Naturally it is also possible to use a clock generator which can produce oscillations itself and which is not connected to the master clock. This has the advantage that the microcontroller can switch off its master clock (sleep mode, power saving mode) and the pulse width modulation can still continue to run.

Figure 5:
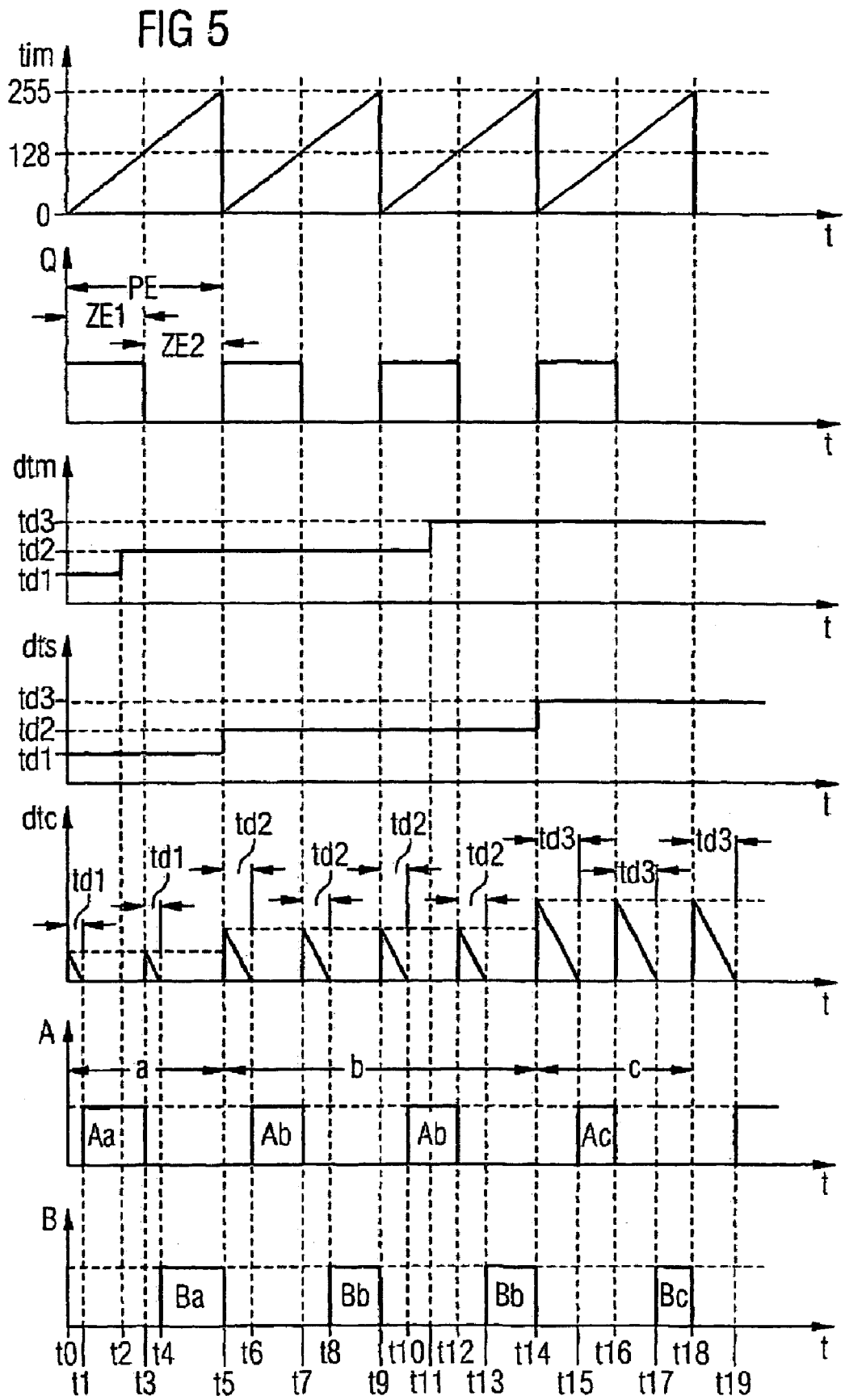

In the example shown, the timer TIM supplied by the Clock Source CLK is an automatically resettable count register with appropriate resolution (e.g. 16 bit) and creates with its count the basis for comparison with the period and pulse width registers explained in greater detail below. On incrementation it produces a waveform as shown in FIG. 5, with the timer waveform being shown as tim. The curve depicted as almost a straight line is in reality naturally a step function (a count state is held for a defined time before it is increased or reset to zero).

Furthermore a Duty Cycle Master Register DCM can be seen in FIG. 4. The duty cycle is set with this register DCM, i.e. the ratio of the switch-on time to the period duration or the switch-on ratio in the time area ZE1 or in the time area ZE2 to the overall duration of the time area ZE1, ZE2 (0%-100% of the time section ZE1, ZE2). When the appropriate counter status is reached for a period the value is transferred from the Duty Cycle Master DCM into a Duty Cycle Slave DCS register.

This Duty Cycle Slave Register DCS is directly involved in the generation of the pulse width ratio.

This double buffering of the duty cycle register by use of a master DCM and of a slave DCS makes it possible to change the duty cycle at basically any given time since a change of the duty cycle at a given time initially only leads to a change in the corresponding value in the master DCM and thereby still has no effects on the actual duty cycle. The effects on the duty cycle are only produced in the next or the desired following period for which the change is to be effective in that then the master updates the duty cycle slave DCS with the corresponding value which then leads to a corresponding change of the settings of the duty cycle. Effects of the change at the duty cycle register in a specific period thus take effect at the earliest in the following period.

Furthermore in FIG. 4 a first comparator CO1 can be seen which compares the counter status of the timer TIM with the value of the duty cycle slave DCS register. If the counts are the same a reset signal rset is output and is forwarded to the Output Control Block OCB. A signal dint is generated which can the further processed as an interrupt and the dead time td1 for the output B begins to run.

With a second comparator CO2 the status of the timer TIM is further compared with the value of a period slave register PSR in which the period duration is stored. If these counts are the same a set signal is activated and this signal set: is forwarded to the Output Control Block OCB. A signal is generated which can be further processed as an interrupt pint. In this way the end of the period is displayed.

In addition the timer TIM is reset to a value of "0" the values from the master registers, such as for example the Period Master Register, but also those in the master registers listed below, are transferred into the slave registers and the dead time for the output "A" begins to elapse.

The Period Master PMR is used for setting the period duration of the pulse-width modulated signals. Any resolutions of the pulse width up to the maximum resolution of the timer TIM can thus be set. The timer TIM will be incremented up to this value before being reset to "0".

When the time for a period is reached the value is transferred from the Period Master Register PMR into the Period Slave Register PSR. This Slave Register PSR is directly involved in the creation of the period duration as described above.

In its turn double buffering through use of Master PMR and Slave PSR generally allows the period to be changed at any given point in time. The effects of change are not felt until the subsequent period at the earliest. It is thus possible to change very easily between different frequencies without influencing the current period duration.

The components of importance for the invention are described below. By contrast with conventional microcontrollers, in which only one dead time register is provided, there is double buffering of the dead time register with the invention. In this case the register Dead Time Master DTM contains the dead time td, i.e. the value for the time between switching off channel A and switching on channel B and vice versa.

Through the double buffering, i.e. through the additionally present register Dead Time Slave DTS, it now becomes possible for the value of the dead time td in the Master Register DTM to be changed at any given time without this having direct undesired effects on the signals at the outputs on the microcontroller. Only once a complete period has elapsed at the earliest will the value be transmitted into the Slave Register DTS and only at this point in time will the signals then be correspondingly symmetrically changed at the output A, B.

As described, the Dead Time Slave Register DTS is directly involved in creating the dead time. In FIG. 5 further down the effect of a dead time change for two outputs on a microcontroller CON will also be explained in more detail.

Basically with such a type of double-buffered dead time register not just two but also a number of outputs can be correspondingly activated.

If a number of dead time registers or pairs of dead time registers are used (e.g. five independent dead time registers are needed for a 5-phase motor) a separate dead time can naturally be set for each output or for each start point or for a number of contiguous output groups in each case and these times can be changed independently of each other.

The Reset Block RES finally serves to generate the pulse width, i.e. the switch-on and switch-off time of the individual outputs for the Output Control Block OCB, with this pulse width being created from the period duration and the duty cycle, as has been explained above.

The Output Control Block OCB finally includes items such as one or more Dead Time Counters DT with which or with the aid of which the dead time modulation corresponding to the values set in the dead time registers is performed. In this case one such Dead Time Counter is needed for each dead time to be created.

In addition in this control block OCB the control for one, two or more outputs can occur (with and without dead time modulation), and different bridge configurations can be set (half bridge, full bridge, ac bridge, 5-phase bridge, . . . ).

FIG. 4 finally shows Status Lines STL as well as Input Lines for bridge control, with INL indicating Interrupt Lines.

After this general explanation of the components involved, the invention will be described in greater detail for various signals with reference to the signal sequences shown in FIG. 5 in conjunction with the block diagram in accordance with FIG. 4.

The designations on the diagram are to be viewed in conjunction with the block diagram.

A 8-bit resolution has been selected for the example, i.e. the counts run from 0 through 255 ($2^8$=256).

To obtain a maximum pulse width of the signals to be modulated of 50% of the period duration which is advantageous for the invention, the limit of the count for the pulse width lies at 128.

This value—the actual time specified is only produced by the clock source and prescalers for the timer TIM—is stored in the Duty Cycle Slave Register DCS. The comparator CO1 compares the status of the timer TIM with the value set in the register DCS, and as soon as this is reached, a reset signal rset is generated and forwarded via the Reset Block RES to the Output Control Block OCB. The signal generated at the output Q of the Set/Reset Block RES has the timing sequence shown in FIG. 5, i.e. after the timer bar of the timer TIM has reached the value set in the Register DCS, the signal Q goes from "high" to "low".

"Q" designates the output from the Set/Reset block RES and shows a signal duty cycle with 50%, i.e. the signal at the output Q of the block RES is thus on "high" for the first half of the period PE and on "low" for the second half, which means a duration of 50% of the period PE of the time area ZE1 at output A and 50% of the period PE of the time area ZE2 at the output B.

As already explained above, Dead Time Counter DTC in the Output Control Block OCB indicates a counter which delays the switching on of the corresponding outputs by the dead time td, with this counter being loaded with the value for the dead time stored in the Dead Time Slave Register. Basically, depending on how many outputs are to be controlled independently of each other, a number of such counters can be provided.

The Dead Time Counter DTC is loaded at the beginning of each full period with the value of the Dead Time Slave and subsequently counts down to zero. Only then are the corresponding outputs enabled. if the pulse width, i.e. the time area ZE1 at output Q for example, is less than the specified dead time, the corresponding output is never set and always remains switched off.

It should be noted that to create the maximum possible switch-on time of an output the maximum pulse width, i.e. 100% of the time area ZE1, as well as the minimum dead time, i.e. a value of zero, is to be set. The dead time value and the pulse width thus have the opposite effect, a maximum value dead time means a pulse width of zero in the time areas ZE1, ZE2.

As can be seen from FIG. 5 the pulse width is exactly symmetrical, viewed over each period. A and B here indicate the two outputs of the microcontroller, a, b, c the three different modulation sections (t0-t5: section a, t5-t14: section b, t14-t19: section c, . . . ).

The update of master to slave registers and the writing of the Dead Time Counter or Counters DTC always only ever occurs at the end of a full period. This avoids the pulse-width modulated signals becoming asymmetrical or pulses getting lost or being changed during a period.

The individual time sections in FIG. 5 are explained in more detail below.

t0-t1:

The Dead Time Slave is set with a specific value dts=td1, accordingly the Dead Time Counter DTC begins to count down from this value dts to zero at point t0, as can be seen from the signal form in FIG. 5. (time t0 is thus the earliest possible time for channel A at which the signal at output A would go to "high" if a dead time had been set to zero.) The value zero for the signal dtc is reached at point t1, at this point the dead time (with the duration td1=t1-t0) has elapsed, and the output signal at output A is set to "high" (signal Aa) for the rest of the time area ZE1.

t2:

At this point, by program for example, the Master Register DTM is changed for the dead time. As can be seen from the signal form dtm the current value of the signal dtm=td1, which corresponds to the value of the signal dts is increased by a specific value (or reduced, not shown), i.e. the dead time is set to the current value of the signal dtm=td2. This change only effects the Dead Time Master DTM and thus has no effect on the current period. There can thus be a relatively free choice of the point in time at which the change is made and it should merely be chosen to be well before the current period elapses, so that any computations are completed in good time before the period elapses.

t3:

At this point output A is switched off since its switch-on time (=duration of the time area ZE1 minus the dead time td1) has elapsed (t3="earliest" point in time for the signal at output B). At each end of the pulse width set within a period PE, i.e. here of the end of the switch-on time for the output A, the dead time count register dtc is set to the value for dts set in the Dead Time Slave, i.e. to td1. Thus in this case the dead time td1 for is started for output B, which in its turn is exactly the same size as that for output A.

t4:

At this point t4 the dead time td1 has elapsed, the output B is switched on and a pulse Ba is produced.

t5:

The time t5 designates the end of a period PE, in this case the first period shown, and the output B is switched off.

In addition, the new, current value of the Dead Time Master register DTM is loaded into the corresponding Slave Register DTS, as can also be seen from the change in the signal form of the curve dts, and simultaneously the new value for the dead time td2 corresponding to the new value for dts in the dead time counter DTC is loaded into the Output Control Block OCB.

t5-t11:

Starting at t5, the counter DTC counts down from the new value for dts to zero (t6), output A generates a corresponding signal Ab. At point t7 the signal Ab at output A is at an end, the dead time is counted down for the output B, and the Signal B is set at point t8 to "high" (signal Bb), corresponding to the new value of the dead time td2. The two sequences Ab and Bb repeat in the next period.

At point t11 the Master Register for the dead time is again changed (new dead time td3), in the example it is set to an even higher value dtm. The change only takes effect in the Dead Time Master DTM and thus has no effect on the current period, corresponding to behavior at point t2.

t11-t14:

The outputs A and B continue to generate pulse-width modulated signals corresponding to the set dead time td2 for the time b.

t14:

The point t14 again signifies the end of a period, and output B is switched off.

The value of the Dead Time Master register td3 is loaded into the corresponding Slave register and simultaneously into the counter of the Output Control Block.

t14-t19:

In accordance with this newly loaded dead time td3, outputs A and B again create corresponding signals, such as shown in FIG. 5, where, after the dead time td3 has elapsed, at points t15 or t17, the signal at the output A is set to "high" (signal Ac) or the signal at the output B to "high" (signal Bc).

In order to now be able to produce a corresponding curve form with the transformer, e.g. a sine-wave curve for rectifier applications, the resolution must be made large.

The 8-bit resolutions shown are only to be seen as examples. In order for example to be able to perform a mains power feed, a resolution of 10-12 bits or more should be used.

In accordance with FIG. 5, with the two-channel signals A, B the pulses of the one signal fall into the gaps of the second signal. However this is not required.

Alternatively or additionally, for pulse width modulation, the period duration can also be changed, which also produces a symmetrical change of the pulse widths. In addition to the change in the period duration, the duty cycle must then also be changed using the Duty Cycle Register in order to obtain a duty cycle of 50%.

In this way a modulation method such as for example FSK (Frequency Shift Keying) is possible. Naturally this alternative or additional variation option to changing the dead time is only to be used if a change of the period duration is desired or at least has no adverse effects.

The principle procedure for changing the period duration is again the same as changing the dead time, namely double buffering of the period duration by using a Period Master and a Period Slave Register PMR, PSR, where it is possible to first generate a new period duration and to buffer it in the Master PMR, without causing any unwelcome changes to the period duration during the current period. At the beginning of the next period or the required period the current value of the period duration is then overwritten in the Slave Register PMR with the new value of the Master register and this value is then changed to the currently applicable value for the period duration up to the next change.

Figure 6:
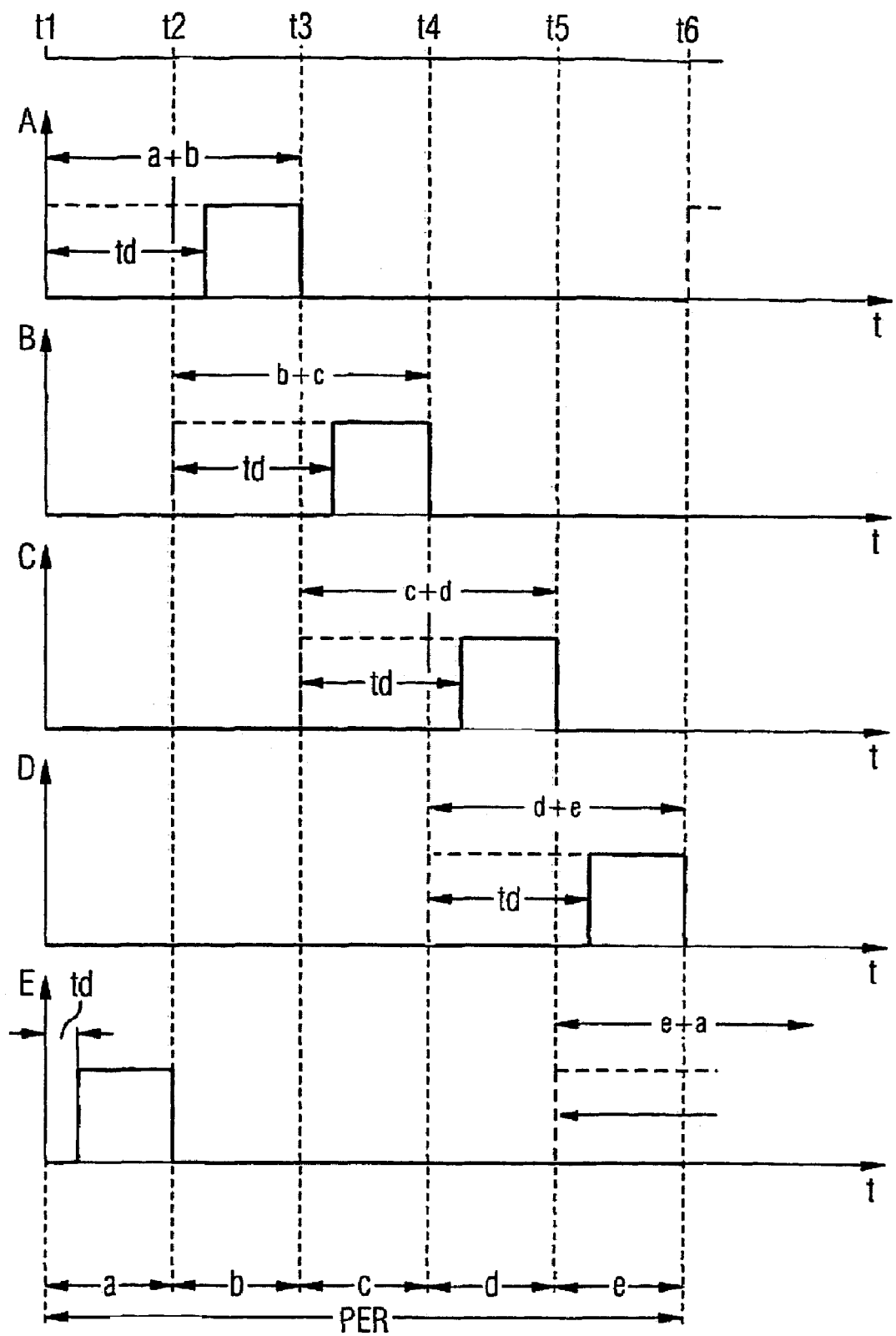

Finally FIG. 6 shows the signal form for a 5-phase control of a motor for example. In accordance with FIG. 6, a period a cycle PER comprises 5 phases or time areas a, b, c, d, e. According to the example the maximum switch-on duration for a channel extends over two time sections, i.e. for channel A over the time sections a+b (channel B: b+c; channel C: c+d; channel D: d+e; channel E: e+a, with this last time section a already lying in the new period).

The current dead time td begins to run for each channel at the beginning of a specific time section, e.g. for channel A in the period shown at point t1, for channel C e.g. at point t3, etc.

As can be seen from this exemplary embodiment, overlapping areas are thus also possible for the maximum pulse width, and basically it would also then be possible to select the dead time so that high signals of different channels overlap in time, and thus the signal form can no longer be "symmetrical".

At point t1 the slave registers for the dead time are loaded with the current "value td for the dead time; the master can the if desired be loaded during the period t1-t6 with a new value for the dead time, which is then written at point t6, i.e. the beginning of the new cycle, into the slave register. As a result of overlapping areas it is necessary here for each channel A-E to be supplied via a separate slave register for the dead time, thus for the master to update 5 slave-registers which then "execute" in turn. Were the signals, i.e. the maximum possible pulse durations (a+b; b+c; etc.) of the signals not to overlap, only one slave register would be necessary within the framework of double buffering.

With the method shown in accordance with the invention for pulse-width modulation an important aspect is that the center of the modulated pulse of the signal is shifted as well in each case. Other methods are known where modulation is around the center, i.e. the position of the center remains unchanged during a modulation. Trials and calculations have shown however that such methods have major disadvantages as regards the electromagnetic compatibility in major frequency ranges compared to the existing method and thus make it necessary to use filters, which are not used in the present invention.

The additional effort arising with the invention compared to a conventional microcontroller from the double buffering of the corresponding registers in the PWM part is very small compared to the benefit of the present invention.

The chip surface is only increased by a few registers, this does not produce any noticeable increase in costs in the end product since the surface area only increases by a few $um^2$.

Naturally with the new concept a "normal" PWM can be created, without having to change the existing programs or circuits.

If this type of hardware is implemented on the chip 90% of the program resources can be saved. This available program time in the microprocessor is then free for additional control and regulation tasks. It enables a switch to be made to a better controller for a product while retaining the same performance.

The invention is suitable for example for use in clocked power supplies, for inverters, solar inverters, mains-controlled inverter applications, e.g. feeding power back into the public power network in which a direct current or a rectified alternating current is to be converted into another alternating current, preferably at lower frequency. In addition the invention is also suitable for clocked current and voltage supplies and for motor control.

The invention claimed is:

1. A method for producing multi-channel pulse width modulated rectangular pulses, comprising:
    discharging a pulse in a plurality of channels in a first period;
    delaying an inception of the pulse by a current dead time, the current dead time kept constant for the first period;
    producing a new dead time for a modulation of a pulse width; and
    overwriting the current dead time with a value of the new dead time at a beginning of either the first or second period.

2. The method according to claim 1, wherein the current dead time separates two consecutive pulses in different channels.

3. The method according to claim 2, wherein the consecutive pulses are within a same period.

4. The method according to claim 1, wherein the new dead time is buffered independently of the current dead time, the current dead time is overwritten with the value of the new dead time at the beginning of the second period.

5. The method according to claim 4, wherein the second period is between the first dead period in a last channel of the first period and an end of the first period.

6. The method according to claim 1, wherein the current dead time is overwritten with the value of the new dead time at the beginning of each period.

7. The method according to claim 1, wherein a maximum pulse width for a channel is set to a duration of the first period divided by a number of channels.

8. The method according to claim 7, wherein the maximum pulse width is half the time duration of the first period for two channels.

9. The method according to claim 1, wherein for n number of channels, after the time duration of the pulse width has elapsed for a maximum pulse width for a first to n−1 channel, an interrupt signal is created and a beginning of the current dead time for the next channel is shown.

10. The method according to claim 9, wherein at the end of the first period a second interrupt signal is generated marking the beginning of a new period or marking the current dead time for a first channel.

11. The method according to claim 10, wherein the second interrupt signal initiates the overwriting of the current dead time.

12. A device for producing multi-channel pulse width modulated rectangular pulses, comprising:
    a plurality of channels within a period, each channel having an equal size;
    a dead time master register;
    a dead time slave register; and
    a new dead time buffered independently of the value stored in the dead time slave register.

13. The device according to claim 12, wherein the value stored in the dead time slave register is overwritten with the value stored in the dead time master register at the beginning of a desired period.

14. The device according to claim 13, wherein the value stored in the dead time slave register is overwritten with the value stored in the dead time master register at the beginning of each period.

15. A method for producing multi-channel pulse width modulated rectangular pulses, comprising:
    providing a number of channels within a period, each channel having an equal size;
    inserting a current dead time onto the channel;
    inserting a pulse onto the channel;
    producing a new dead time for a modulation of a pulse width; and
    setting the current dead time to the new dead time after the current dead time has been inserted onto each channel of the period.

16. The method according to claim 15, wherein the number of channels is two.

* * * * *